(12) United States Patent
Gao et al.

(10) Patent No.: US 11,404,662 B2
(45) Date of Patent: Aug. 2, 2022

(54) DISPLAY PANEL, PACKAGING COVER PLATE AND MANUFACTURING METHOD OF THE SAME FOR IMPROVED DISPLAY AND PACKAGING EFFECT

(71) Applicant: BOE TECHNOLOGY GROUP CO., LTD., Beijing (CN)

(72) Inventors: Xinwei Gao, Beijing (CN); Donghui Yu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 11 days.

(21) Appl. No.: 16/914,604

(22) Filed: Jun. 29, 2020

(65) Prior Publication Data
US 2021/0028386 A1    Jan. 28, 2021

(30) Foreign Application Priority Data

Jul. 22, 2019   (CN) .......................... 201910659469.9

(51) Int. Cl.
| | | |
|---|---|---|
| *H01L 29/08* | (2006.01) | |
| *H01L 51/52* | (2006.01) | |
| *H01L 27/32* | (2006.01) | |
| *H01L 51/56* | (2006.01) | |

(52) U.S. Cl.
CPC .......... *H01L 51/524* (2013.01); *H01L 27/322* (2013.01); *H01L 27/3244* (2013.01); *H01L 51/56* (2013.01)

(58) Field of Classification Search
CPC .................................................. H01L 51/524
See application file for complete search history.

(56) References Cited

U.S. PATENT DOCUMENTS

| | | | | |
|---|---|---|---|---|
| 8,004,184 B2 * | 8/2011 | Han | ..................... | H01L 51/5256 313/506 |
| 2005/0280356 A1 * | 12/2005 | Murayama | .......... | H01L 51/0011 313/503 |
| 2015/0001576 A1 * | 1/2015 | Iwata | .................. | H01L 51/5256 257/100 |

(Continued)

FOREIGN PATENT DOCUMENTS

| | | |
|---|---|---|
| CN | 203826395 U | 9/2014 |
| CN | 104617234 A | 5/2015 |

(Continued)

OTHER PUBLICATIONS

First Office Action for CN Patent Application No. 201910659469.9 dated Feb. 3, 2021.

*Primary Examiner* — Caleb E Henry
(74) *Attorney, Agent, or Firm* — Perilla Knox & Hildebrandt LLP; Kenneth A. Knox

(57) ABSTRACT

This disclosure relates to a display panel, a packaging cover plate, and a manufacturing method of a packaging cover plate, and relates to the field of display technology. The packaging cover plate includes a base, a color film layer, and a blocking layer. The color film layer is disposed at a side of the base, and includes a pixel defining layer and a filter layer divided into a plurality of sub-pixels by the pixel defining layer. The blocking layer is disposed at a side of the color film layer away from the base and is capable of blocking gases. The packaging cover plate can improve packaging effect and ensure the display effect.

14 Claims, 3 Drawing Sheets

(56) References Cited

U.S. PATENT DOCUMENTS

| | | | | |
|---|---|---|---|---|
| 2016/0254474 A1* | 9/2016 | Zou | ................... | H01L 51/5253 |
| | | | | 257/40 |
| 2016/0300888 A1* | 10/2016 | Wang | ................... | H01L 51/56 |
| 2016/0307977 A1* | 10/2016 | Liu | ................... | H01L 51/5024 |
| 2016/0365395 A1* | 12/2016 | Xu | ................... | H01L 51/5253 |
| 2016/0372713 A1* | 12/2016 | Wang | ................... | H01L 51/5293 |
| 2017/0025642 A1* | 1/2017 | Li | ................... | H01L 51/5253 |
| 2017/0249880 A1* | 8/2017 | Wang | ................... | G06F 3/047 |
| 2018/0010244 A1* | 1/2018 | Okamoto | ........... | H01L 51/5237 |
| 2018/0047943 A1* | 2/2018 | Hu | ................... | G02F 1/1347 |

FOREIGN PATENT DOCUMENTS

| | | | |
|---|---|---|---|
| CN | 105093646 A | 11/2015 | |
| CN | 105514145 A | 4/2016 | |
| CN | 107591430 A | 1/2018 | |
| CN | 107731873 A | 2/2018 | |

\* cited by examiner

DISPLAY PANEL, PACKAGING COVER PLATE AND MANUFACTURING METHOD OF THE SAME FOR IMPROVED DISPLAY AND PACKAGING EFFECT

CROSS-REFERENCE TO RELATED APPLICATIONS

This application is based on, claims the benefit of, and claims priority to Chinese Patent Application No. 201910659469.9, filed on Jul. 22, 2019, the entire contents of which are incorporated herein by reference.

TECHNICAL FIELD

This disclosure relates to the field of display technology and, in particular, to a display panel, a packaging cover plate, and a method for manufacturing the packaging cover plate.

BACKGROUND

Packaging is an essential process for manufacturing a display panel that prevents water vapor and oxygen from corroding the display panel and ensuring the display effect. In particular, with respect to an organic light-emitting diode (OLED) display panel, a light emitting device of the OLED display panel is easily corroded by water vapor and oxygen, thus affecting the light emitting effect of the display panel. Currently, when a display panel is packaged, a packaging cover plate and a display substrate having light emitting devices are required to be installed opposite to each other.

It should be noted that the information disclosed in the above "Background" section is merely intended to reinforce understanding of the background technology of the present disclosure and, accordingly, the Background may include information that does not constitute the prior art as already known by an ordinary person skilled in the art.

SUMMARY

The present disclosure provides a display panel, a packaging cover plate, and a manufacturing method thereof, which can improve the packaging effect to prevent the display device from coming into contact with oxygen and ensure the display effect.

According to an aspect of the present disclosure, a packaging cover plate is provided. The packaging cover plate includes a base, a color film layer, and a blocking layer. The color film layer is disposed at a side of the base, and includes a pixel defining layer and a filter layer which is divided into a plurality of sub-pixels by the pixel defining layer. The blocking layer is disposed at a side of the color film layer facing away from the base, and is capable of blocking gases.

In an exemplary embodiment of the present disclosure, the packaging cover plate further includes a planarization layer covering the color film layer, and the blocking layer covers the planarization layer.

In an exemplary embodiment of the present disclosure, the blocking layer covers a surface of the planarization layer facing away from the base and sidewalls of the planarization layer.

In an exemplary embodiment of the present disclosure, a material of the blocking layer includes at least one of aluminum oxide, silicon nitride, silicon oxide, or silicon oxynitride.

In an exemplary embodiment of the present disclosure, a material of at least one of the pixel defining layer, the filter layer, or the planarization layer includes a photoresist, and a material of the blocking layer includes at least one of silicon oxynitride or silicon oxide.

In an exemplary embodiment of the present disclosure, the packaging cover plate further includes a support disposed on a surface of the blocking layer facing away from the base.

In an exemplary embodiment of the present disclosure, the packaging cover plate further includes a support disposed on a surface of the planarization layer facing away from the base, and the blocking layer covers the support.

According to an aspect of the present disclosure, a manufacturing method of a packaging cover plate is provided. The manufacturing method includes: forming a color film layer at a side of a base, wherein the color film layer includes a pixel defining layer and a filter layer which is divided into a plurality of sub-pixels by the pixel defining layer; and forming a blocking layer capable of blocking gases at a side of the color film layer facing away from the base.

In an exemplary embodiment of the present disclosure, before forming the blocking layer, the manufacturing method further includes forming a planarization layer that covers the color film layer. Forming a blocking layer capable of blocking gases at a side of the color film layer facing away from the base includes forming a blocking layer that covers the planarization layer and capable of blocking gases.

In an exemplary embodiment of the present disclosure, the blocking layer covers a surface of the planarization layer facing away from the base and sidewalls of the planarization layer.

In an exemplary embodiment of the present disclosure, the manufacturing method further includes forming a support on a surface of the blocking layer facing away from the base.

In an exemplary embodiment of the present disclosure, before forming the blocking layer, and after forming the planarization layer, the manufacturing method further includes forming a support on a surface of the planarization layer facing away from the base. Forming a blocking layer capable of blocking gases at a side of the color film layer facing away from the base includes forming the blocking layer which covers the planarization layer and the support, and is capable of blocking gases.

According to an aspect of the present disclosure, a display panel including the packaging cover plate of any of the above embodiments is provided.

In an exemplary embodiment of the present disclosure, the display panel further includes a display substrate, wherein the display substrate and the packaging cover plate are disposed opposite to each other with an adhesive filled therebetween.

In an exemplary embodiment of the present disclosure, the display substrate includes a plurality of light emitting devices corresponding to the sub-pixels one by one. The light emitting devices are OLED light emitting devices.

According to an aspect of the present disclosure, a display device including the above-mentioned display panel is provided.

According to the display panel, the packaging cover plate, and the manufacturing method of the same of the present disclosure, the blocking layer capable of blocking gases is disposed at a side of the color film layer facing away from the base, so that after the packaging cover plate and the display substrate are disposed opposite to each other. Gases, such as oxygen or the like released from the color film layer when being heated are blocked by the blocking layer, which not only can avoid outside gases from going into the display panel, but also prevent the display device from being corroded by gases generated inside the display panel, thereby improving the packaging effect and ensuring the display effect.

It should be understood that both the foregoing general description and the following detailed description are exemplary and explanatory only and are not restrictive of the disclosure.

BRIEF DESCRIPTION OF THE DRAWINGS

The accompanying drawings, which are incorporated in and constitute a part of this specification, illustrate embodiments consistent with the present disclosure and together with the description, serve to explain the principles of the present disclosure. It should be apparent that the drawings in the following description are merely examples of this disclosure, and that other drawings may also be obtained by those ordinary skilled in the art without creative work.

DETAILED DESCRIPTION

Figure 1:
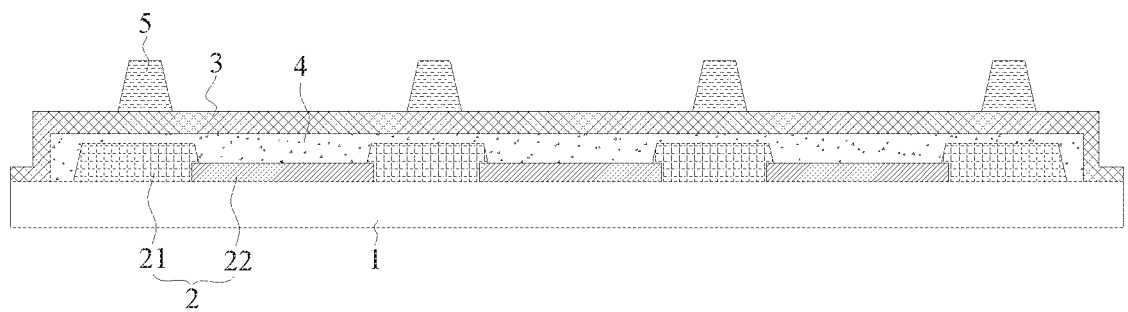
FIG. 1 is a schematic view of a packaging cover plate according to an embodiment of the present disclosure.

Now, the exemplary embodiments will be described more fully with reference to the accompanying drawings. However, the exemplary embodiments can be embodied in a variety of forms and should not be construed as limiting the embodiments set forth herein. Instead, these embodiments are provided so that the present disclosure will be thorough and complete, and the concepts of the exemplary embodiments will be fully given to those skilled in the art. The same reference numerals denote the same or similar structures in the drawings, and thus their detailed descriptions will be omitted. In addition, the drawings are merely schematic illustrations of the present disclosure, and are not necessarily drawn to scale.

Although relative terms such as "above" and "under" are used herein to describe the relationship of one component relative to another component, such terms are used herein only for the sake of convenience, for example, in the direction shown in the figure, it should be understood that if the referenced device is inversed upside down, a component described as "above" will become a component described as "under". When a structure is described as "above" another structure, it probably means that the structure is integrally formed on another structure, or, the structure is "directly" disposed on another structure, or, the structure is "indirectly" disposed on another structure through an additional structure.

The terms "a," "an," "the," "said," and "at least one" are used to express the presence of one or more the element, constitute, component, or the like. The terms "comprise," "include," and "have" are intended to be inclusive, and mean there may be additional elements, constituents, components, or the like other than the listed elements, constituents, components, or the like. The labels "first" and "second" are used only as markers, and are not numerical restriction to the objects.

The present disclosure provides a packaging cover plate, which may be installed opposite to a display substrate to obtain a display panel. The display substrate may have a plurality of light emitting devices distributed in an array. The light emitting devices may be OLED (Organic Light Emitting Diode) light emitting devices, and the specific structure of the light emitting device is not particularly limited herein.

Figure 2:
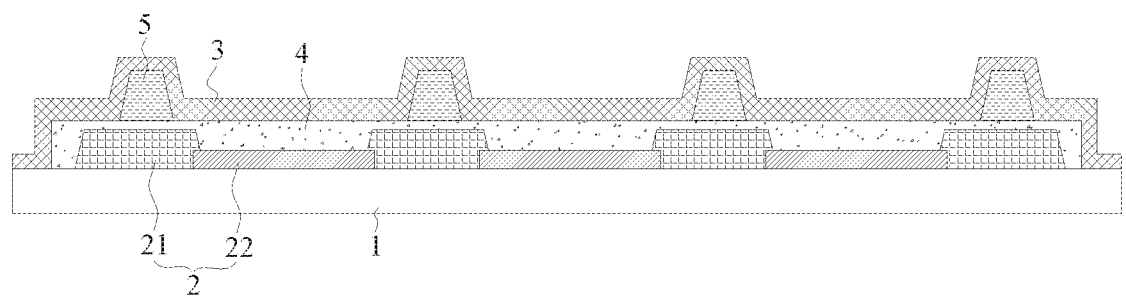
FIG. 2 is a schematic view of a packaging cover plate according to an embodiment of the present disclosure.
Figure 3:
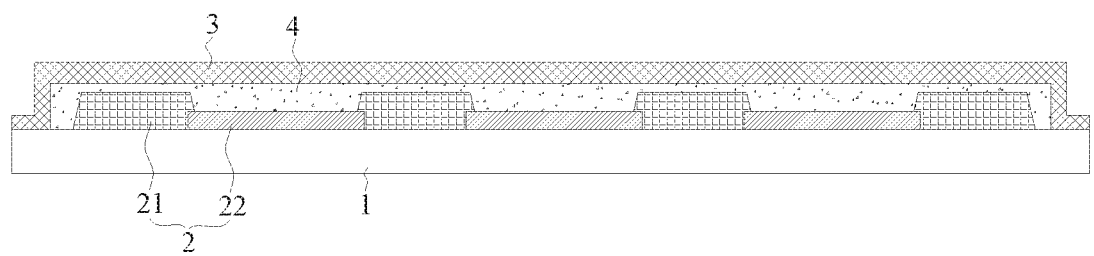
FIG. 3 is a schematic view of a packaging cover plate according to an embodiment of the present disclosure.

As shown in FIG. 1 to FIG. 3, the packaging cover plate of the embodiment of the present disclosure includes a base 1, a color film layer 2, and a blocking layer 3.

The color film layer 2 is disposed at a side of the base 1, and the color film layer 2 includes a pixel defining layer 21 and a filter layer which is divided into a plurality of sub-pixels 22 by the pixel defining layer 21. The blocking layer 3 is disposed at a side of the color film layer 2 facing away from the base 1 and is capable of blocking gases.

In the packaging cover plate of the embodiments of the present disclosure, the blocking layer 3 capable of blocking gases is disposed at a side of the color film layer 2 facing away from the base 1, so that after the packaging cover plate and the display substrate are disposed opposite to each other, gases, such as oxygen or the like, released from the color film layer 2 when being heated are blocked by the blocking layer 3, which not only can avoid outside gases from going into the display panel, but also prevent the display device from being corroded by gases generated inside the display panel, thereby improving the packaging effect and ensuring the display effect.

Hereinafter, various parts of the packaging cover plate according to embodiments of the present disclosure are described in detail.

As shown in FIGS. 1-3, the base 1 has a flat plate structure, and the material thereof may be a hard material such as glass or quartz, or a flexible material such as PET (polyethylene terephthalate). The material will not be particularly limited as long as it is a transparent material. The base 1 has a display region and a peripheral region surrounding the display region, and shapes of the display region and the peripheral region will not be particularly limited herein.

As shown in FIGS. 1-3, the color film layer 2 is disposed at a side of the base 1 and located in the display region. The color film layer 2 includes a pixel defining layer 21 and a filter layer, and the pixel defining layer 21 divides the filter layer into a plurality of sub-pixels 22.

For example, both the pixel defining layer 21 and the filter layer are disposed on the same surface of the base 1. The pixel defining layer 21 has a plurality of hollowed-out sub-pixel regions. The filter layer includes a plurality of sub-pixels 22 spaced apart from one another. The filter layer is covered by the pixel defining layer 21. The sub-pixel regions correspond to the sub-pixels 22 one by one and expose the sub-pixels 22.

The sub-pixels 22 may be divided into a plurality of groups, each group of sub-pixels 22 forms a pixel. Colors of the sub-pixels 22 of the same pixel are different from each other, for example, each pixel includes three sub-pixels 22 having red, green and blue colors, respectively. Meanwhile, the light emitting device of the display substrate may be used to emit white light, and light emitted from the packaging cover plate may show various colors by the filtering action of the sub-pixels 22, thereby displaying images.

A material of the filter layer may include a negative photoresist, and of course, may also include a positive photoresist or other materials, and the material is not particularly limited as long as it can filter light. The thickness of the filter layer may be 0.1 μm-5 μm, such as 0.1 μm, 1 μm, 3 μm, or 5 μm, etc., and of course, may also be less than 0.1 μm or greater than 5 μm.

A material of the pixel defining layer 21 may include a positive photoresist, a negative photoresist, or other materials, and the pixel defining layer 21 has a light shielding structure. The thickness of the pixel defining layer 21 may be 0.1 μm to 5 μm, such as 0.1 μm, 1 μm, 3 μm, or 5 μm, etc., and of course, may also be less than 0.1 μm, or greater than 5 μm.

As shown in FIGS. 1-3, the blocking layer 3 is disposed at a side of the color film layer 2 facing away from the base 1, and is capable of blocking oxygen and other gases released by the color film layer 2 from flowing to the display substrate, thereby preventing the display device from being corroded by the gases. The material of the blocking layer 3 may include at least one of aluminum oxide, silicon nitride, silicon oxide, or silicon oxynitride, and of course, may also include other materials capable of blocking the gases, which are not listed individually herein.

In order to improve the blocking effect, the color film layer 2 may be completely blocked by the blocking layer 3. For example, the blocking layer 3 has edges extending to the peripheral region of the base 1 and contacting with the peripheral region, so as to block the surface of the color film layer 2 facing away from the base 1 and sidewalls of the color film layer 2, and thereby completely blocking the gases released from the color film layer 2.

As shown in FIGS. 1-3, the packaging cover plate of the embodiment of the present disclosure further includes a planarization layer 4, which may cover the color film layer 2. The surface of the planarization layer 4 facing away from the base 1 is a plane, and the sidewalls of the planarization layer 4 cover the sidewalls of the color film layer 2. The material of the planarization layer 4 may include a positive photoresist, a negative photoresist, or other transparent materials, and the thickness of the planarization layer 4 may be 0.1 μm to 5 μm, such as 0.1 μm, 1 μm, 3 μm, or 5 μm, and of course, may be less than 0.1 μm or greater than 5 μm.

In order to prevent the display device from being corroded by the gases such as oxygen released from the planarization layer 4, the blocking layer 3 covers the planarization layer 4, and further, the blocking layer 3 may cover the surface of the planarization layer 4 facing away from the base 1 and the sidewalls of the planarization layer 4, so that the planarization layer 4 and the color film layer 2 are coated within the blocking layer 3 to block the gases released from the color film layer 2 and the planarization layer 4.

For example, the material of each of the pixel defining layer 21, the filter layer and the planarization layer 4 includes a photoresist. The material of the blocking layer 3 includes at least one of silicon oxynitride or silicon oxide, and a refractive index of the silicon oxynitride and the silicon oxide approximate to that of the photoresist, thereby avoiding the blocking layer 3 from having a great influence on the light path; at the same time, the silicon oxynitride and the silicon oxide may also improve flow leveling effect of the adhesive filled between the packaging cover plate and the display substrate during the packaging process.

The packaging cover plate may also include a support 5 (for example, a supporting post) that plays a supporting role between the packaging cover plate and the display substrate. There may be a plurality of supports 5 distributed in an array, and the specific number of the supports is not limited herein. However, a projection of the support 5 on the color film layer 2 is outside the sub-pixels 22, so that the support 5 cannot shield the sub-pixels 22.

The material of the support 5 may be a photoresist or other material, and the height of each support 5 may be the same, and the height may be 0.5 μm to 8 μm, such as 0.5 μm, 1 μm, 3 μm, 8 μm, etc., and of course, may also be less than 0.5 μm or greater than 8 μm. The support 5 may be cylindrical shape, prismatic shape, circular truncated cone, truncated pyramid, or the like, and the shape of the support is not particularly limited herein.

As shown in FIG. 1, in the packaging cover plate according to an embodiment of the present disclosure, the support 5 is disposed on the surface of the blocking layer 3 facing away from the base 1, and an end of the support 5 facing away from the base 1 may abut against the display substrate.

As shown in FIG. 2, in the packaging cover plate according to an embodiment of the present disclosure, the support 5 is disposed on the surface of the planarization layer 4 facing away from the base 1, and the blocking layer 3 covers the support 5. If the support 5 is made of a material capable of releasing gases, the blocking layer 3 can block the gases.

As shown in FIG. 3, in the packaging cover plate according to an embodiment of the present disclosure, the packaging cover plate may not be provided with the support 5, but may be completely attached to the planarization layer 4.

Figure 4:
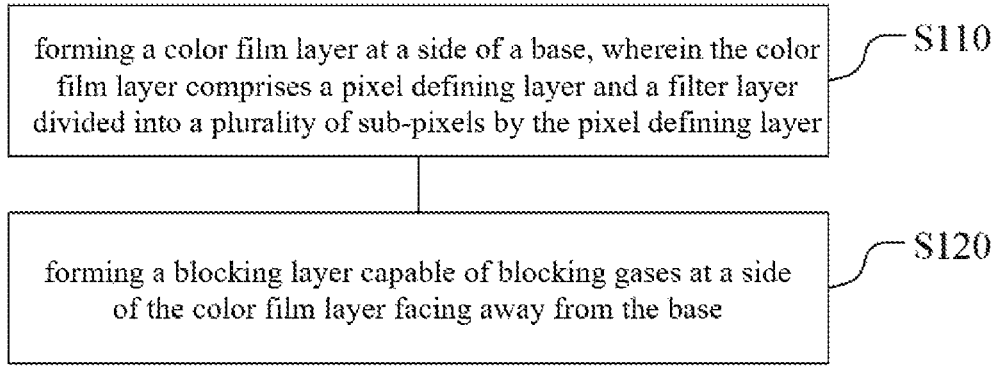
FIG. 4 is a flowchart of a manufacturing method according to an embodiment of the present disclosure.

The embodiment of the present disclosure provides a manufacturing method of a packaging cover plate, which is used to manufacture the packaging cover plate of the above embodiments, and the specific structure of the packaging cover plate is not described any more herein. As shown in FIG. 4, in an embodiment of the manufacturing method, the manufacturing method includes steps of S110 and S120:

S110: forming a color film layer at a side of a base, wherein the color film layer includes a pixel defining layer and a filter layer which is divided into a plurality of sub-pixels by the pixel defining layer; and S120: forming a blocking layer capable of blocking gases at a side of the color film layer facing away from the base.

Beneficial effects of the manufacturing method of the embodiment of the present disclosure may refer to the beneficial effects of the packaging cover plate, which are not repeated herein.

Hereinafter, various steps of the manufacturing method of the embodiment of the present disclosure are described in detail.

In S110, the specific structure of the color film layer 2 has been described in detail in the above embodiment of the packaging cover plate, and is not repeated herein. For example, S110 includes steps of S1110 and S1120:

In S1110, i.e., forming a filter layer at a side of the base, the filter layer includes a plurality of sub-pixels spaced apart from one another, wherein the filter layer may be formed at a side of the base 1 by a photolithography process, which may include exposure, development, and the like, and the specific structure and the material of the filter layer may refer to that of the embodiments of the packaging cover plate;

In S1120, i.e., forming a pixel defining layer on the base for dividing the sub-pixels, wherein the pixel defining layer 21 may be formed on the base 1 with the filter layer formed thereon by a photolithography process, and the specific structure and the material of the pixel defining layer 21 may refer to that of the embodiments of the packaging cover plate, and will not be described in detail herein.

In S120, the blocking layer 3 may be formed by sputtering, chemical vapor deposition, atomic layer deposition, and the like, and the specific structure and the material of the blocking layer 3 may refer to that of the embodiments of the packaging cover plate, which is not described in detail herein.

Figure 5:
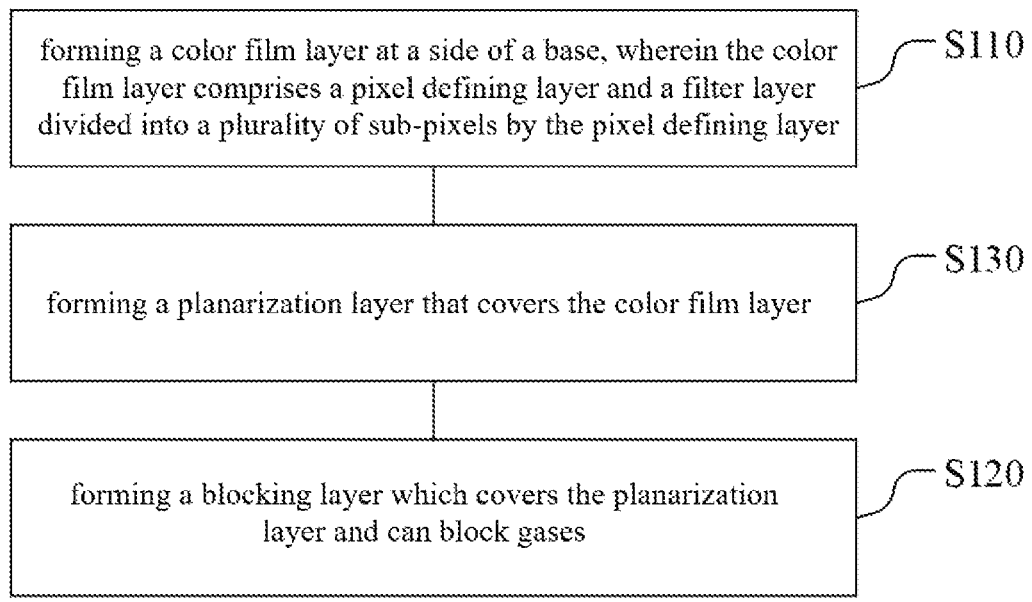
FIG. 5 is a flowchart of a manufacturing method according to an embodiment of the present disclosure.

As shown in FIG. 5, in the manufacturing method according to an embodiment of the present disclosure, before the step of forming the blocking layer 3, that is, before S120, the manufacturing method according to the embodiment of the present disclosure further includes a step of:

S130: forming a planarization layer that covers the color film layer.

Corresponding to S130, S120 includes:

forming a blocking layer which covers the planarization layer and can block gases.

As shown in FIGS. 1-3, the blocking layer 3 may cover a surface of the planarization layer 4 facing away from the base 1 and sidewalls of the planarization layer 4, so that the planarization layer 4 and the color film layer 2 are coated within the blocking layer 3, to block the gases released from the color film layer 2 and the planarization layer 4.

Figure 6:
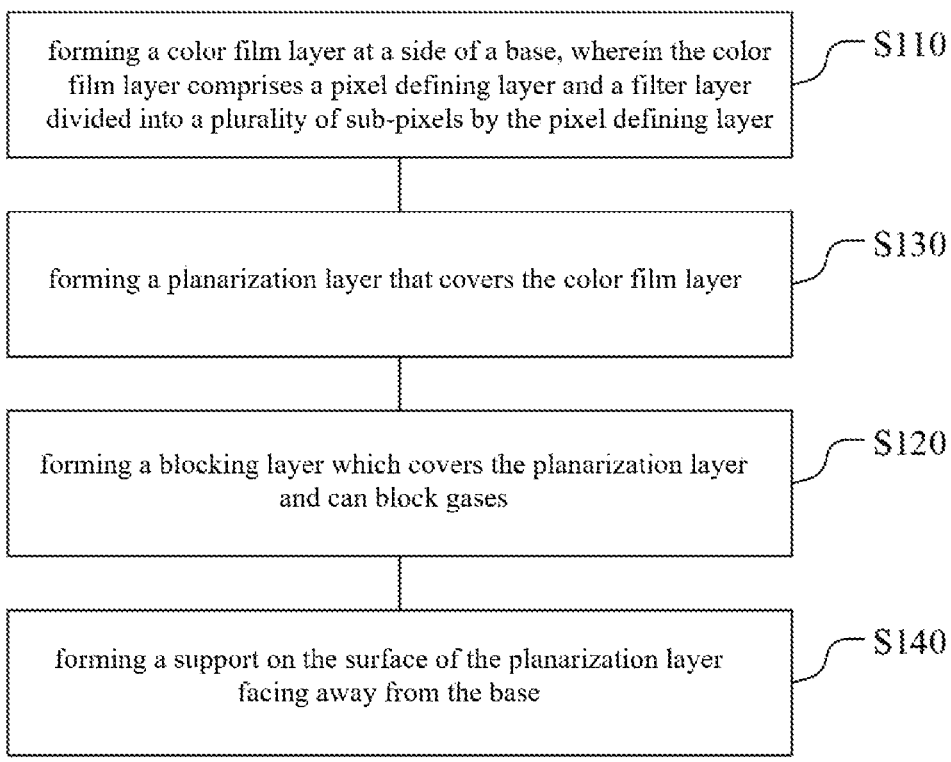
FIG. 6 is a flowchart of a manufacturing method according to an embodiment of the present disclosure.

As shown in FIG. 6, in the manufacturing method according to an embodiment of the present disclosure, the manufacturing method according to the embodiment of the present disclosure further includes a step of:

S140, forming a support on the surface of the blocking layer facing away from the base.

As shown in FIG. 1, the specific structure and the material of the support 5 in this embodiment may refer to that of the corresponding embodiment of the packaging cover plate, and are not described in detail herein.

Figure 7:
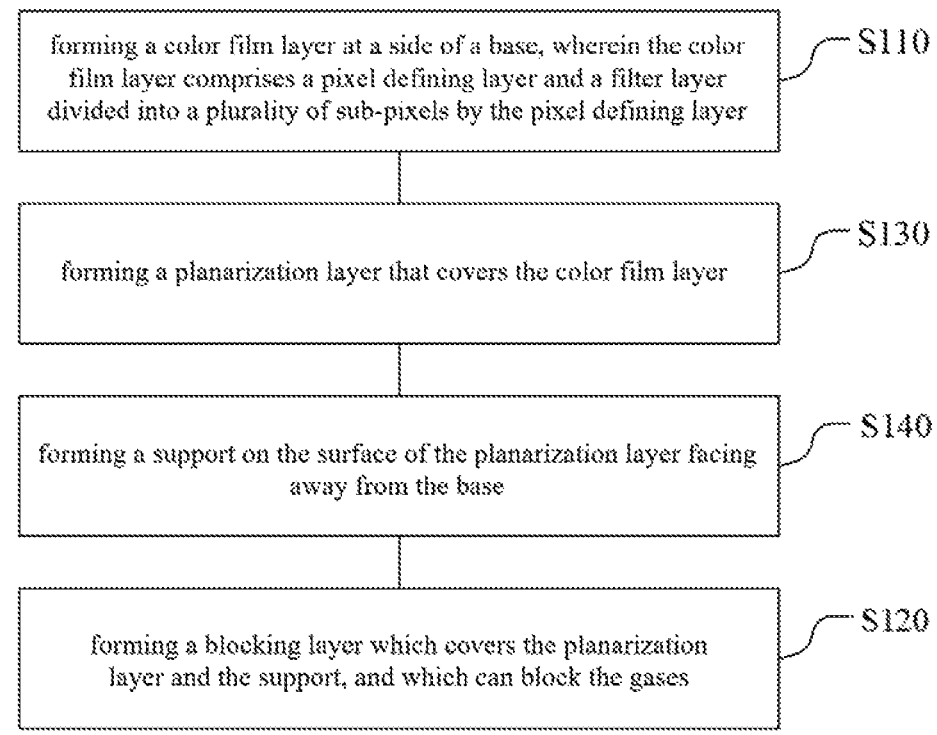
FIG. 7 is a flowchart of a manufacturing method according to an embodiment of the present disclosure.

As shown in FIG. 7, in the manufacturing method according to an embodiment of the present disclosure, before forming the blocking layer and after forming the planarization layer, that is, before S120 and after S130, the manufacturing method according to the embodiment of the present disclosure further includes a step of:

S140: forming a support on the surface of the planarization layer facing away from the base.

Corresponding to S140, S120 includes:

forming a blocking layer which covers the planarization layer and the support, and which can block the gases.

As shown in FIG. 2, the specific structure and the material of the support 5 of the present embodiment may refer to that of the corresponding embodiment of the packaging cover plate, and are not described in detail herein.

It should be noted that In addition, although the various steps of the method of the present disclosure are described in a particular order in the figures, it is not required or implied that the steps must be performed in the particular order, or all the illustrated steps must be performed to achieve the desired result. Additionally or alternatively, some steps may be omitted, or multiple steps may be combined into one step to be performed, and/or one step is decomposed into multiple steps to be performed.

The embodiments of the present disclosure provide a display panel including a display substrate and the packaging cover plate according to any one of the above embodiments. The display substrate and the packaging cover plate are disposed opposite to each other and packaged by Dam & Fill packaging process, and an adhesive is filled between the display substrate and the packaging cover plate. The blocking layer 3 is blocked between the color film layer 2 and the display device, to prevent the display device from being corroded by the gases released from the color film layer 2, and thereby ensuring the display effect.

The display substrate includes a plurality of light emitting devices, which may be OLED light emitting devices, corresponding to the respective sub-pixels 22 one by one. The display panel may be used for terminal equipment such as mobile phones and tablets to display images.

Other embodiments of the disclosure will be apparent to those skilled in the art from consideration of the specification and practice of the disclosure disclosed herein. This application is intended to cover any variations, uses, or adaptations of the disclosure following, in general, the principles of the disclosure and including such departures from the present disclosure as come within known or customary practice in the art to which the disclosure pertains. It is intended that the specification and examples be considered as exemplary only, with a true scope and spirit of the disclosure being indicated by the following claims.

What is claimed is:

1. A packaging cover plate, comprising:
a base;
a color film layer at a side of the base, the color firm layer comprising a pixel defining layer and a filter layer divided into a plurality of sub-pixels by the pixel defining layer, the pixel defining layer having a light shielding structure;
a blocking layer at a side of the color film layer facing away from the base and configured to block gases; and
a planarization layer covering the color film layer, sidewalls of the planarization layer covering sidewalls of the color film layer, and the blocking layer coving the planarization layer.

2. The packaging cover plate of claim 1, wherein the blocking layer covers a surface of the planarization layer facing away from the base and sidewalls of the planarization layer.

3. The packaging cover plate of claim 1, wherein a material of the blocking layer comprises at least one of: aluminum oxide, silicon nitride, silicon oxide, and silicon oxynitride.

4. The packaging cover plate of claim 1, wherein a material of at least one of the pixel defining layer, the filter layer, or the planarization layer comprises a photoresist, and a material of the blocking layer comprises at least one of silicon oxynitride or silicon oxide.

5. The packaging cover plate of claim 1, further comprising a support on a surface of the blocking layer facing away from the base.

6. The packaging cover plate of claim 1, further comprising a support on a surface of the planarization layer facing away from the base, wherein the blocking layer covers the support.

7. A display panel with a packaging cover plate, wherein the packaging cover plate comprises:
a base;
a color film layer at a side of the base, the color film layer comprising a pixel defining layer and a filter layer divided into a plurality of sub-pixels by the pixel defining layer, the pixel defining layer having a light shielding structure;
a blocking layer at a side of the color film layer facing away from the base that blocks gases; and
a planarization layer covering the color film layer, sidewalls of the planarization layer covering sidewalls of the color film layer, and the blocking layer coving the planarization layer.

8. The display panel of claim 7, wherein the blocking layer covers a surface of the planarization layer facing away from the base and sidewalls of the planarization layer.

9. The display panel of claim 7, wherein a material of the blocking layer comprises at least one of: aluminum oxide, silicon nitride, silicon oxide, and silicon oxynitride.

10. The display panel of claim 7, wherein a material of at least one of the pixel defining layer, the filter layer, or the planarization layer comprises photoresist, and a material of the blocking layer comprises at least one of silicon oxynitride or silicon oxide.

11. The display panel of claim 7, wherein the packaging cover plate further comprises: a support on a surface of the blocking layer facing away from the base, or on a surface of the planarization layer facing away from the base, the blocking layer covering the support.

12. The display panel of claim 7, further comprising a display substrate, wherein the display substrate and the packaging cover plate are disposed opposite to each other with an adhesive filled therebetween.

13. The display panel of claim 12, wherein the display substrate comprises a plurality of light emitting devices corresponding to the sub-pixels one by one, and the light emitting devices are organic light-emitting diode (OLED) light emitting devices.

14. The display panel of claim 7, wherein the display panel is implemented in a display device.

* * * * *